(12) United States Patent
Ijiri et al.

(10) Patent No.: US 8,772,787 B2
(45) Date of Patent: Jul. 8, 2014

(54) PREPARED AND STORED GAN SUBSTRATE

(71) Applicant: Sumitomo Electric Industries, Ltd., Osaka (JP)

(72) Inventors: Hideyuki Ijiri, Itami (JP); Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/907,995

(22) Filed: Jun. 3, 2013

(65) Prior Publication Data

US 2013/0256696 A1    Oct. 3, 2013

Related U.S. Application Data

(63) Continuation of application No. 13/188,475, filed on Jul. 22, 2011, now Pat. No. 8,476,158, which is a continuation-in-part of application No. 12/877,086, filed on Sep. 7, 2010, now Pat. No. 8,227,826, which is a continuation of application No. 11/762,786, filed on Jun. 14, 2007, now Pat. No. 7,811,908.

(30) Foreign Application Priority Data

Jun. 14, 2006    (JP) .................................. 2006-164832

(51) Int. Cl.
*H01L 29/15*    (2006.01)
*H01L 31/0256*    (2006.01)

(52) U.S. Cl.
USPC ............................... 257/76; 257/99; 257/684

(58) Field of Classification Search
USPC .......... 438/604; 257/76, 81, 98, 99, 678, 684; 206/524.1, 524.6
See application file for complete search history.

(56) References Cited

U.S. PATENT DOCUMENTS 6,211,089 B1    4/2001    Kim et al.
6,527,857 B1    3/2003    Pankove
(Continued)

FOREIGN PATENT DOCUMENTS

CN    1464543 A    12/2003
CN    1581525 A    2/2005
(Continued)

OTHER PUBLICATIONS

K. Prabhakaran et al., "Nature of Native Oxide on GaN Surface and Its Reaction with Al", Applied Physics Letters, Nov. 18, 1996, pp. 3212-3214, vol. 69, No. 21, American Institute of Physics, NY.

(Continued)

*Primary Examiner* — Michelle Mandala
(74) *Attorney, Agent, or Firm* — James W. Judge

(57) ABSTRACT

A GaN substrate is stored within an atmosphere in which the oxygen concentration is not greater than 15 vol. % and the water-vapor concentration is not greater than 20 g/m$^3$. The GaN substrate (1) has a planar first principal face (1$m$), and in an arbitrary point (P) along the first principal face (1$m$) and separated 3 mm or more from the outer edge thereof, the GaN substrate's plane orientation has an off-inclination angle $\Delta\alpha$ of $-10°$ or more, $10°$ or less with respect to the plane orientation of an arbitrarily designated crystalline plane (1$a$) that is inclined $50°$ or more, $90°$ or less with respect to a plane (1$c$), being either the (0001) plane or the (000$\bar{1}$) plane, through the arbitrary point. This enables storing GaN substrates whose principal-face plane orientation is other than (0001) or (000$\bar{1}$), making available GaN substrates with which semiconductor devices of favorable properties can be manufactured.

6 Claims, 8 Drawing Sheets

(56) References Cited

U.S. PATENT DOCUMENTS

| | | |
|---|---|---|
| 6,875,082 B2 | 4/2005 | Nakayama et al. |
| 7,501,299 B2 | 3/2009 | Wong et al. |
| 2003/0118746 A1 | 6/2003 | Kim |
| 2005/0095861 A1 | 5/2005 | Ueno et al. |
| 2005/0269577 A1 | 12/2005 | Ueda et al. |
| 2006/0032428 A1 | 2/2006 | Dwilinski et al. |
| 2006/0086948 A1 | 4/2006 | Ohno et al. |
| 2006/0286817 A1 | 12/2006 | Kato et al. |
| 2007/0277731 A1 | 12/2007 | Han |
| 2008/0003440 A1 | 1/2008 | Ijiri et al. |

FOREIGN PATENT DOCUMENTS

| | | |
|---|---|---|
| CN | 1681974 A | 10/2005 |
| CN | 101090062 A | 12/2007 |
| CN | 101308896 A | 11/2008 |
| EP | 1868252 A2 | 12/2007 |
| EP | 1995786 A1 | 11/2008 |
| JP | H02-204400 A | 8/1990 |
| JP | H10-163114 A | 6/1998 |
| JP | H11-274567 A | 10/1999 |
| JP | 2000-082676 A | 3/2000 |
| JP | 2000-355392 A | 12/2000 |
| JP | 2001-053011 A | 2/2001 |
| JP | 2002-204400 A | 7/2002 |
| JP | 2003-197534 A | 7/2003 |
| JP | 2004-043281 A | 2/2004 |
| JP | 2004-104089 A | 4/2004 |
| JP | 2004-349502 A | 12/2004 |
| JP | 2004-356609 A | 12/2004 |
| JP | 2005-029233 A | 2/2005 |
| JP | 2006-0001647 A | 1/2006 |
| JP | 2006-315947 A | 11/2006 |
| JP | 2007-335583 A | 12/2007 |
| JP | 2008-285364 A | 11/2008 |

OTHER PUBLICATIONS

Yohei Enya et al.,"531 nm Green Lasing of InGaN Based Laser Diodes on Semi-Polar {20-21} Free-Standing GaN Substrates," Applied Physics Express 2, 2009, pp. 082101-1 to 082101-3, The Japan Society of Applied Physics, Japan.

Yusuke Yoshizumi et al., "Continuous-Wave Operation of 520 nm Green InGaN-Based Laser Diodes on Semi-Polar {20-21} GaN Substrates," Applied Physics Express 2, 2009, pp. 092101-1 to 092101-3, The Japan Society of Applied Physics, Japan.

"Sumitomo Denko Jitsuyouka ni Medo," Nikkan Kogyo Shinbun, Aug. 20, 2009, pp. 9, Nikkan Kogyo Shinbun, Ltd. Japan.

Tadashi Nezu, ed. "Ryokushoku Handoutai ga Tsuini Hassin / Sumitomo Denko ga Parusu Kudou ni Seikou," Nikkei Electronics, Aug. 24, 2009, pp. 15, Nikkei BP Marketing, Japan.

Technical Standardization Committee on Semiconductor Devices, Handling Guidance for Semiconductor Devices, Mar. 1996, p. 25 Electric Industries Association of Japan.

PREPARED AND STORED GAN SUBSTRATE

BACKGROUND OF THE INVENTION

1. Technical Field

The present invention relates to GaN substrates whose principal-face plane orientation is other than (0001) or (000$\overline{1}$), stored under predetermined storage conditions, and relates to semiconductor devices and methods of their manufacture, in which an at least single-lamina semiconductor layer is formed onto such GaN substrates.

2. Description of the Related Art

GaN substrates are widely employed in light-emitting diodes (LEDs), laser diodes (LDs) and other semiconductor devices.

In thus employing GaN substrates, the process whereby the substrates are manufactured is ordinarily separate from the process whereby the manufactured GaN substrates are used to produce semiconductor devices, meaning that the manufactured GaN substrates are stored for a fixed time period, and then used to produce the semiconductor devices. Therefore, various methods of housing and storing manufactured GaN substrates have been proposed to date. (For example, cf. Japanese Unexamined Patent App. Pub. 2000-355392).

With these conventional GaN substrate-storing methods, however, inasmuch as the GaN substrates are housed and stored under a clean air atmosphere, the surface of the GaN substrates oxidizes due to the prolonged storage, which has been prohibitive of manufacturing semiconductor devices with favorable properties.

BRIEF SUMMARY OF THE INVENTION

The present invention is directed to solving this problem, and an object of the invention is to make available: GaN substrates prepared and stored such as to enable semiconductor devices of favorable properties to be manufactured from the GaN substrates, and semiconductor devices and methods of their manufacture, in which an at least single-lamina semiconductor layer is formed on the GaN substrates.

Particularly, an object of the present invention, to solve the problems discussed above, is to make available: stored GaN substrates, prepared such that the principal-face plane orientation of the GaN substrates is other than (0001) or (000 $\overline{1}$), with which semiconductor devices of favorable properties such as enabling maintenance of photoemission efficiency at a high level, and reduction of blue-shift in the emission from LEDs (light-emitting diodes), LDs (laser diodes) and like semiconductor devices, can be manufactured; semiconductor devices in which an at least single-lamina semiconductor layer is formed onto the GaN substrates; and a method of manufacturing such semiconductor devices.

The present invention, in accordance with a certain aspect thereof, is a GaN substrate stored within an atmosphere in which the oxygen concentration is not greater than 15 vol. % and the water-vapor concentration is not greater than 20 g/m$^3$, the GaN substrate having opposite sides encompassed by a peripheral edge, one of said opposite sides being a planar first principal face and the other of said opposite sides being a second principal face, said first principal face having an average roughness Ra of not greater than 20 nm and being of plane orientation having, in an arbitrary point along the first principal face and separated at least 3 mm from said peripheral edge, an off-inclination angle of between −10° and 10°, inclusive, with respect to an arbitrarily designated crystalline plane, through said arbitrary point, of plane orientation inclined between 50° and 90°, inclusive, with respect to either the (0001) plane or the (000$\overline{1}$) plane, and said second principal face having an average roughness Ra of not greater than 20 µm.

Therein, the oxygen concentration can be made 10 vol. % or less, and the water-vapor concentration 15 g/m$^3$ or less. Furthermore, the oxygen concentration can be brought to 6 vol. % or less, and the water-vapor concentration to 5 g/m$^3$ or less. Likewise, the atmosphere under which the GaN substrate is stored can be formed from a gaseous mixture containing an inert gas, gaseous oxygen, and water vapor, with the oxygen concentration being made not less than 0.05 vol. % and the water-vapor concentration not less than 0.1 g/m$^3$.

Optionally, the stored GaN substrate may be prepared such that the average roughness Ra of the first principal face is not greater than 5 nm, while the average roughness Ra of the second principal face is not greater than 10 µm.

And in a stored GaN substrate according to the present invention, it is possible to have the plane orientation of the arbitrarily designated crystalline plane be {20$\overline{2}$1}. Therein, the plane orientation in an arbitrary point along the first principal face and separated 3 mm or more from the outer edge thereof can have an off-inclination angle of −10° or more, 10° or less in a <1$\overline{2}$10> direction with respect to {20$\overline{2}$1}, and of −10° or more, 10° or less in a direction perpendicular to a <20$\overline{2}$1> direction and to a <1$\overline{2}$10> direction. Likewise, the plane orientation in an arbitrary point along the first principal face and separated 3 mm or more from the outer edge thereof can have an off-inclination angle of −3° or more, 3° or less in a <1$\overline{2}$10> direction with respect to {20$\overline{2}$1}, and of −3° or more, 3° or less in a direction perpendicular to a <20$\overline{2}$1> direction and to a <1$\overline{2}$10> direction. Furthermore, the plane orientation in an arbitrary point along the first principal face and separated 3 mm or more from the outer edge thereof can have an off-inclination angle of −0.5° or more, 0.5° or less in a <1$\overline{2}$10> direction with respect to {20$\overline{2}$1}, and of −0.5° or more, 0.5° or less in a direction perpendicular to a <20$\overline{2}$1> direction and to a <1$\overline{2}$10> direction.

The present invention affords: stored GaN substrates whose principal-face plane orientation is other than (0001) or (000$\overline{1}$), with which semiconductor devices of favorable properties can be manufactured; semiconductor devices in which an at least single-lamina semiconductor layer is formed onto the GaN substrates; and a method of manufacturing such semiconductor devices.

DETAILED DESCRIPTION OF THE INVENTION

In crystallography, in order to express the plane orientation of crystalline planes, notation (Miller notation) such as (hkl) or (hkil) is used. The plane orientation of crystalline planes in Group III-nitride crystal and other hexagonal-system crystal constituting GaN parent crystal, GaN parent-crystal pieces, GaN crystal, GaN substrates, etc., is expressed by (hkil). Herein, h, k, i and l are integers referred to as Miller indices, and have the relationship i=−(h+k). A plane of (hkil) plane orientation is called an (hkil) plane. Likewise, the direction perpendicular to the (hkil) plane (the direction normal to the (hkil) plane) is called the [hkil] direction. And {hkil} signifies a family of plane orientations that includes (hkil) and the individual plane orientations that are its crystallographic equivalent, while <hkil> signifies a family of directions that includes [hkil] and the individual directions that are its crystallographic equivalent.

Embodying Mode 1

Figure 1:
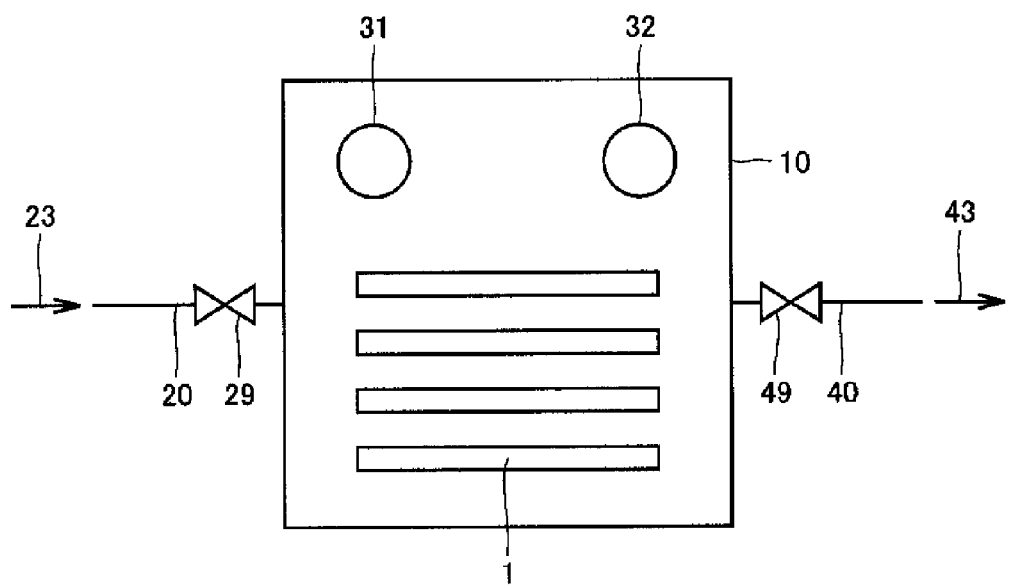
FIG. 1 is a schematic diagram representing one mode of embodying a GaN substrate storage method involving the present invention.
Figure 2:
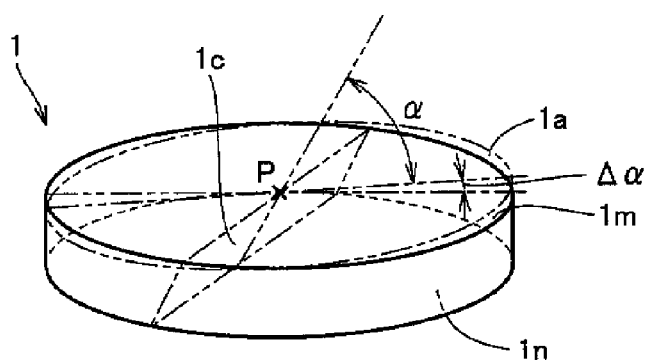
FIG. 2 is a schematic diagram representing one mode of embodying a GaN substrate involving the present invention.

Reference is made to FIG. 1 and FIG. 2: One mode of embodying a GaN substrate storage method involving the present invention stores, within an atmosphere in which the oxygen concentration is not greater than 15 vol. % and the water-vapor concentration is not greater than 20 g/m$^3$, a GaN substrate 1 having a planar first principal face 1$m$, and whose plane orientation in an arbitrary point P along the first principal face 1$m$ and separated 3 mm or more from the outer edge thereof has an off-inclination angle (in FIG. 2, off-inclination angle Δα) of −10° or more, 10° or less with respect to the plane orientation of an arbitrarily designated crystalline plane 1$a$ that is inclined 50° or more, 90° or less (in FIG. 2, inclination angle α) with respect to a plane, being either the (0001) plane or the (000$\bar{1}$) plane, through the arbitrary point P.

Storing the aforedescribed GaN substrates under the atmosphere in which the oxygen concentration is not greater than 15 vol. % and the water-vapor concentration is not greater than 20 g/m$^3$ makes it possible to keep oxidation of the GaN substrate surfaces to a minimum, enabling the manufacture of semiconductor devices of favorable properties. From such perspectives, the oxygen concentration is preferably not greater than 10 vol. % and the water-vapor concentration not greater than 15 g/m$^3$, and more preferably, the oxygen concentration is not greater than 6 vol. % and the water-vapor concentration is not greater than 5 g/m$^3$. On the other hand, from the perspective of reducing the cost of creating the atmosphere for storing the GaN substrates, preferably the oxygen concentration is 0.05 vol. % or more and the water-vapor concentration is 0.1 g/m$^3$ or more.

Herein, the technique whereby in the atmosphere for storing the above-described GaN substrates the oxygen concentration is made not greater than 15 vol. % and the water-vapor concentration is made not greater than 20 g/m$^3$ is not particularly limited, wherein a storing device 10 as represented in FIG. 1 may for example be employed. Therein, the storing device 10 in FIG. 1 is equipped with a gas introduction line 20, a gas introduction valve 29, a gas exhaust line 40, and a gas exhaust valve 49.

As a way to have the oxygen concentration be no more than 15 vol. % and the water-vapor concentration be no more than 20 g/m$^3$ in an atmosphere for storing the aforedescribed GaN substrates, one technique (referred to as "Technique I"—likewise below) is, with GaN substrates 1 placed inside the storing device 10, to introduce low gas 23 of oxygen concentration not greater than 15 vol. % and water-vapor concentration not greater than 20 g/m$^3$ into the storing device 10, exhausting gas 43 of oxygen concentration higher than 15 vol. % as well as water-vapor concentration higher than 20 g/m$^3$. Another technique (referred to as "Technique II"—likewise below) is to place, together with the GaN substrates 1, an oxygen scavenger 31 and a dehydrating agent 32$a$ inside the storing device 10. Moreover, Technique I and Technique II can be employed in tandem.

Herein, the gas whose oxygen concentration and water-vapor concentration are, respectively, not greater than 15 vol. % and not greater than 20 g/m$^3$ is not particularly limited, but from the perspective of not causing chemical reactions with the surfaces of the GaN substrates, other than an inert gas such as gaseous nitrogen or gaseous argon, gaseous mixtures containing these inert gases and a predetermined quantity or less of gaseous oxygen and water vapor are preferable. In particular, from a low-cost perspective, a just-mentioned gaseous mixture of an inert gas and gaseous oxygen and water vapor, being a gaseous mixture whose oxygen concentration and water-vapor concentration are, respectively, not greater than 15 vol. % and not greater than 20 g/m$^3$, is preferable. Also, the oxygen scavenger is not particularly limited, but from the perspective of not causing chemical reactions with the GaN substrate surfaces, active iron oxide, activated carbon, or the like is preferable. Likewise, while the dehydrating agent is not particularly limited, from the perspective of not causing chemical reactions with the GaN substrate surfaces, silica gel, activated carbon, or the like is preferable.

Furthermore, the measuring of the oxygen concentration is not particularly limited, but can be carried out by means of a galvanic oxygen analyzer. Likewise, the measuring of the water-vapor concentration is not particularly limited, but may be carried out by means of a dielectric aquameter or a Karl Fischer moisture analyzer.

The temperature of the atmosphere for storing the GaN substrates is also not particularly limited, but from the perspective of not causing chemical reactions with the surface of the GaN substrates, it is preferably not greater than 60° C., with not greater than 40° C. being more preferable. In addition, from the perspective of preventing condensation, 5° C. or greater is preferable, with 10° C. or greater being more preferable.

Figure 3A:
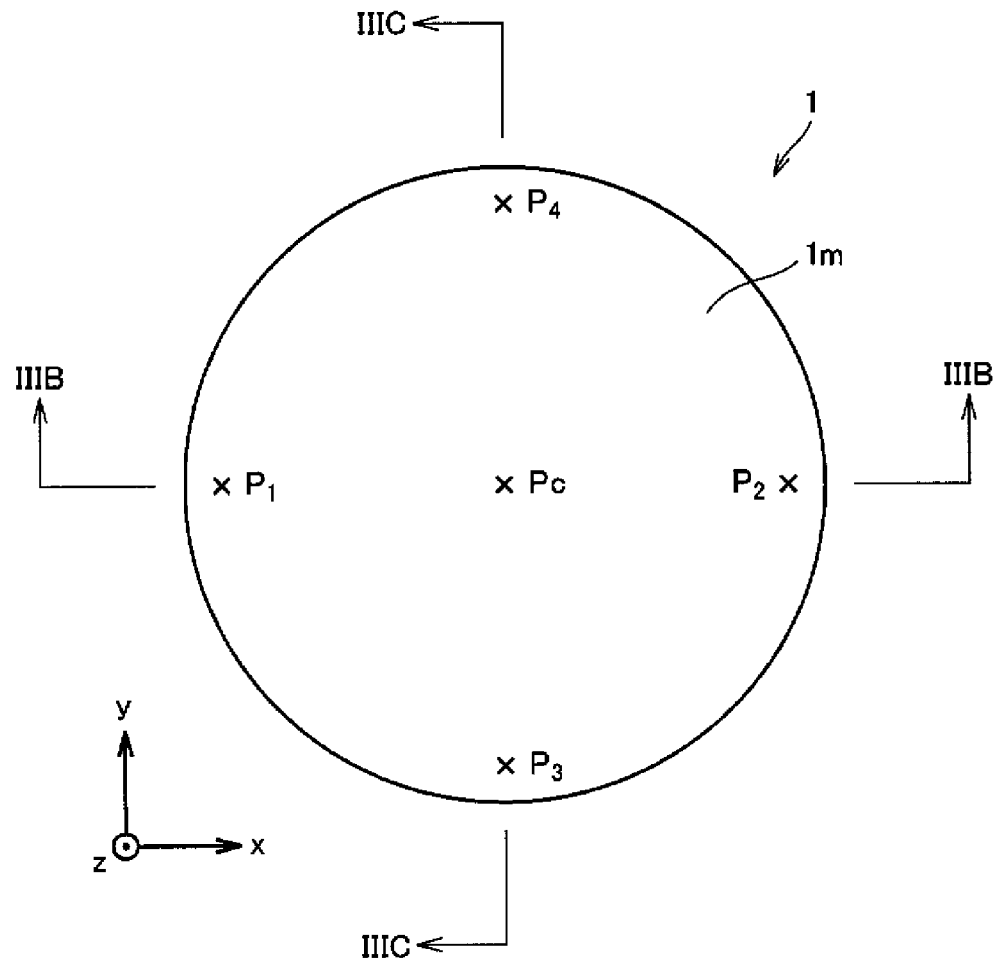
FIG. 3A is a simplified diagram specifically representing one mode of embodying a GaN substrate involving the present invention to depict a simplified plan view of the GaN substrate.
Figure 3B:
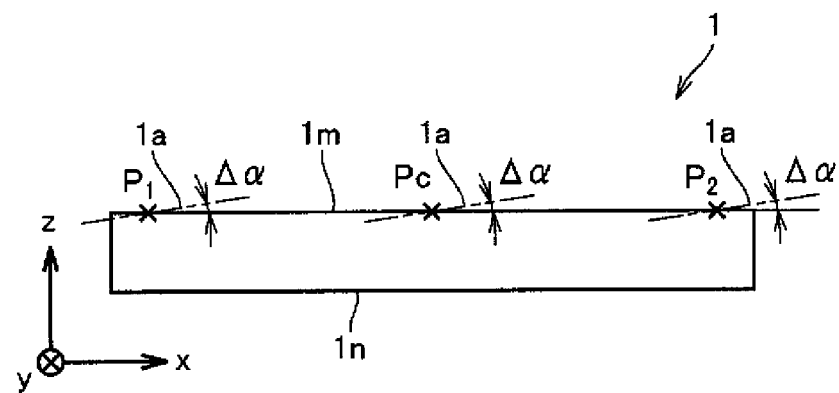
FIG. 3B is a simplified diagram specifically representing one mode of embodying a GaN substrate involving the present invention to depict a simplified sectional view along IIIB-IIIB in FIG. 3A.
Figure 3C:
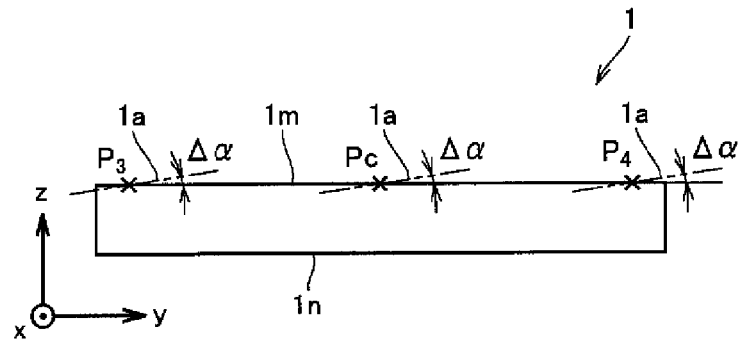
FIG. 3C is a simplified diagram specifically representing one mode of embodying a GaN substrate involving the present invention to depict a simplified sectional view along IIIC-IIIC in FIG. 3A.

A GaN substrate stored in a storage method of the present embodying mode has, referring to FIG. 2 and FIG. 3, a planar first principal face $1m$, and its plane orientation in an arbitrary point P along the first principal face $1m$ and separated 3 mm or more from the outer edge thereof (e.g., Point $P_c$, Point $P_1$, Point $P_2$, Point $P_3$, Point $P_4$, etc.) has an off-inclination angle $\Delta\alpha$ of $-10°$ or more, $10°$ or less with respect to the plane orientation of an arbitrarily designated crystalline plane $1a$ that is inclined $50°$ or more, $90°$ or less (in FIG. 2, inclination angle $\alpha$) with respect to a plane $1c$, being either the (0001) plane or the (000$\bar{1}$) plane, through the arbitrary point P.

With a GaN substrate in the present embodying mode, because (i) it has a planar first principal face $1m$, and (ii) its plane orientation in an arbitrary point along the first principal face $1m$ and separated 3 mm or more from the outer edge thereof has an off-inclination angle $\Delta\alpha$ of $-10°$ or more, $10°$ or less with respect to the plane orientation of an arbitrarily designated crystalline plane $1a$ that is inclined $50°$ or more, $90°$ or less with respect to a plane $1c$, being either the (0001) plane or the (000 $\bar{1}$) plane, through the arbitrary point, by growing an at least single-lamina semiconductor layer onto the first principal face $1m$, a semiconductor device of minimal blue shift in photoemission and high emission efficiency is obtained. In particular, because the off-inclination angle $\Delta\alpha$ of its plane orientation in an arbitrary point along the first principal face $1m$ and separated 3 mm or more from the outer edge thereof is small, in the aforedescribed storing of the GaN substrate, inside the storing device reacting of oxygen and water vapor with the surfaces of the GaN substrate is controlled to a minimum, and the amount of oxygen and water-vapor adsorption onto the GaN substrate surfaces is reduced, whereby high-emission-efficiency semiconductor devices is obtained.

Furthermore, as for GaN substrates of the present embodying mode, from the perspectives of keeping reaction of oxygen and water vapor inside the storing device with the GaN substrate surfaces under control, and of reducing the amount of oxygen and water-vapor adsorption into the GaN substrate surfaces, preferably the average roughness Ra of the first principal face $1m$ is not greater than 20 nm, and the average roughness Ra of the second principal face $1n$ is not greater than 20 μm. From such perspectives, it is more preferable that the average roughness Ra of the first principal face $1m$ be 5 nm or less, and that the average roughness Ra of the second principal face $1n$ be 10 μm or less. Although the relationship between the average roughness Ra of first principal face $1m$ and second principal face $1n$ of the GaN substrate 1 and the reactivity and adsorptivity of oxygen and water vapor with these principal faces $1m$ and $1n$ of the GaN substrate 1 is not clear, the reduction in surface area from lessening the average roughness Ra is believed to be relevant as one causative factor. Herein, the "first principal face $1m$" means the principal face on which semiconductor layers are grown, while the "second principal face $1n$" means the principal face on the side opposite from said first principal face $1m$. Furthermore, "average roughness Ra of a surface" means arithmetic mean roughness Ra stipulated in JIS B 0601:2001, and refers to a value in which a predetermined reference surface area is chosen from the roughness topography along its average plane, and the absolute values of the deviation from the average plane of the chosen portion to the profiling topography are summed and the total is averaged in the reference surface area. Such surface average roughness Ra can be measured employing a non-contact interferometer, 3D-SEM (three-dimensional scanning electron micrometer), AFM (atomic-force microscope), or the like.

With further regard to a GaN substrate of the present embodying mode, referring to FIG. 2, the plane orientation of the foregoing arbitrarily designated crystalline plane $1a$ preferably is {20$\bar{2}$1}. With a GaN substrate 1 in which the plane orientation in an arbitrary point P along the first principal face $1m$ of the GaN substrate 1 and separated 3 mm or more from the outer edge thereof has an off-inclination angle $\Delta\alpha$ of $-10°$ or more, $10°$ or less with respect to {20$\bar{2}$1}, because semiconductor layers of high crystalline quality can be grown stably onto its first principal face $1m$, a semiconductor device of minimal blue shift in photoemission and high emission efficiency is obtained.

Further in respect of a GaN substrate of the present embodying mode, referring to FIG. 2 and FIG. 3, from the perspectives of keeping oxygen and water vapor inside the storing device from reacting with the GaN substrate surfaces, and of reducing the amount of oxygen and water-vapor adsorption into the GaN substrate surfaces, preferably the plane orientation in an arbitrary point P along the first principal face $1m$ and separated 3 mm or more from the outer edge thereof (e.g., Point $P_c$, Point $P_1$, Point $P_2$, Point $P_3$ and Point $P_4$) has an off-inclination angle $\Delta\alpha$ of $-10°$ or more, $10°$ or less in a <1 $\bar{2}$ 10> direction, and of $-10°$ or more, $10°$ or less in a direction perpendicular to a <20 $\bar{2}$ 1> direction and to a <1 $\bar{2}$ 10> direction, more preferably has an off-inclination angle $\Delta\alpha$ of $-3°$ or more, $3°$ or less in a <1 $\bar{2}$ 10> direction with respect to {20$\bar{2}$1}, and of $-3°$ or more, $3°$ or less in a direction perpendicular to a <20 $\bar{2}$ 1> direction and to a <1 $\bar{2}$ 10> direction, and still more preferably has an off-inclination angle of $-0.5°$ or more, $0.5°$ or less in a <1 $\bar{2}$ 10> direction with respect to {20$\bar{2}$1}, and of $-0.5°$ or more, $0.5°$ or less in a direction perpendicular to a <20 $\bar{2}$ 1> direction and to a <1 $\bar{2}$ 10> direction.

While the relationship between the off-inclination angle $\Delta\alpha$ between {20$\bar{2}$1} and the plane orientation in an arbitrary point along the first principal face $1m$ of the GaN substrate 1 and separated 3 mm or more from the outer edge thereof, and the reactivity and adsorptivity of oxygen and water vapor with respect to the first principal face $1m$ of the GaN substrate 1 is not clear, what is believed to be relevant as one causative factor is that having a predetermined off-inclination angle $\Delta\alpha$ varies the number of sites along the first principal face $1m$ of the GaN substrate 1 where oxygen and water vapor may bond. The off-inclination angle $\Delta\alpha$ between {20$\bar{2}$1} and the plane orientation in an arbitrary point along the first principal face of the GaN substrate and separated 3 mm or more from the outer edge thereof can be measured by an XRD (x-ray diffraction) technique.

Here, in the present embodying mode, referring to FIG. 1, with the atmosphere inside the storing device 10 in which the GaN substrates 1 are housed having been rendered storing conditions in the invention of the present application (for example, that the oxygen concentration be not greater than 15 vol. % and the water-vapor concentration be not greater than 20 g/m$^3$), the GaN substrates 1 can be stored by sealing the GaN substrates 1 into a (not-illustrated) storage container (e.g., an aluminum pouch or the like) that shuts out oxygen and water vapor. Further, GaN substrates hermetically sealed in a storage container can be taken out of the storing device 10 and stored.

With reference to FIG. 6, in a GaN substrate manufacturing method of the present embodying mode, while not particularly limited, included are: a step (FIG. 6A) of cutting from a GaN parent crystal 100 a plurality of GaN parent-crystal pieces 100p and 100q having principal faces 100pm and 100qm whose off-inclination angle is −5° or more, 5° or less with respect to a plane orientation {hkil} having an inclination angle α of 50° or more, 90° or less with respect to a plane, being either the (0001) plane or the (000$\bar{1}$) plane, of the GaN parent crystal; a step (FIG. 6B) of arranging the GaN parent-crystal pieces 100p and 100q adjoining each other sideways in such a way that the principal faces 100pm and 100qm of the GaN parent-crystal pieces 100p and 100q parallel each other, and the [0001] directions of the GaN parent-crystal pieces 100p and 100q are identical; a step (FIG. 6C) of growing GaN crystal 110 onto the principal faces 100pm and 100qm of the GaN parent-crystal pieces 100p and 100q; and a step (FIG. 6C) of cutting out a GaN substrate 1 of Embodying Mode 1 from the grown GaN crystal 110.

In the above-described steps, GaN crystal 110 in which the off-angle between the plane orientation of the principal face of a sectional region 110p of the GaN crystal 110 that grows onto the GaN parent-crystal piece 100p, and the plane orientation of the principal face of a sectional region 110q of the GaN crystal 110 that grows onto the GaN parent-crystal piece 100q is −10° or more, 10° or less can be grown. Herein, the sectional regions 110p and 110q of the GaN crystal 110 are regions of the GaN crystal partitioned by planes (referred to as extension planes 110t hereinafter) extending, into the GaN crystal 110 interior, the lateral sides 100pt and 100qt where the GaN parent-crystal pieces 100p and 100q adjoin each other.

By cutting the thus-obtained GaN crystal 110 in planes 110u and 110v parallel to the plane of the {hkil} plane orientation mentioned earlier, a GaN substrate 1 having a planar first principal face 1m, and whose plane orientation in an arbitrary point along the first principal face 1m and separated 3 mm or more from the outer edge thereof has an off-inclination angle of −10° or more, 10° or less with respect to the plane orientation of an arbitrarily designated crystalline plane that is inclined 50° or more, 90° or less with respect to a plane, being either the (0001) plane or the (000$\bar{1}$) plane, through the arbitrary point is obtained.

Therein, from the perspective of making the off-inclination angle through the aforementioned arbitrary point in the GaN substrate 1 small, the off-inclination angle with respect to the aforementioned plane orientation {hkil} of the principal faces 100pm and 100qm of the plurality of GaN parent-crystal pieces 100p and 100q preferably is −10° or more, 10° or less, more preferably −3° or more, 3° or less, still more preferably −0.5° or more, 0.5° or less. And from the perspective of growing GaN crystal of high crystalline quality, the average roughness Ra of the principal faces 100pm and 100qm and lateral sides 100pt and 100qt of the GaN parent-crystal pieces 100p and 100q preferably is not grater than 50 nm, more preferably not greater than 5 nm.

And the method for growing the GaN crystal 110, while not particularly limited preferably is, from the perspective of growing GaN crystal of high crystalline quality, a vapor-phase method such as an HVPE (hydride vapor-phase epitaxy) technique, an MOCVD (metalorganic chemical vapor deposition) technique or an MBE (molecular-beam epitaxy) technique, or a liquid-phase method such as flux growth. From the perspective of the crystal growth rate being considerable, an HVPE technique is further preferable. If the GaN crystal 110 is grown by an HVPE technique, from the perspective of making the off-inclination angle through the aforementioned arbitrary point in the GaN substrate 1 small, the crystal-growth conditions preferably are that the crystal-growth temperature is 950° C. or more, 1200° C. or less, and the crystal-growth rate is 30 μm/hr or more, 300 μm/hr or less.

In a method of manufacturing a GaN substrate of the present embodying mode, a step (FIG. 6D) of utilizing, as a GaN starting substrate 110s, a GaN substrate 1 cut out from the grown GaN crystal 110 in planes 110u and 110v parallel to a plane of {hkil} plane orientation, and growing further GaN crystal 120 onto the principal face 110pm of such GaN starting substrate 110s, and a step (FIG. 6D) of cutting a GaN substrate 1 of Embodying Mode 1 out from the grown further GaN crystal 120 can further be included.

By the above-described steps, further GaN crystal 120 in which the off-angle between the plane orientation of the principal face of a sectional region 120p of the further GaN crystal 120 that grows onto the sectional region 110p of the GaN starting substrate 110s, and the plane orientation of the principal face of a sectional region 120q of the further GaN crystal 120 that grows onto the sectional region 110q of the GaN starting substrate 110s is −10° or more, 10° or less can be grown. Herein, the sectional regions 120p and 120q of the further GaN crystal 120 are regions of the further GaN crystal partitioned by planes (referred to as extension planes 120t hereinafter) extending, into the further GaN crystal 120 interior, the extension planes 110t of the GaN starting substrate 110s.

By cutting the thus-obtained further GaN crystal 120 in planes 120u and 120v parallel to the plane of {hkil} plane orientation, a GaN substrate 1 having a planar first principal face 1m, and whose plane orientation in an arbitrary point along the first principal face 1m and separated 3 mm or more from the outer edge thereof has an off-inclination angle of −10° or more, 10° or less with respect to the plane orientation of an arbitrarily designated crystalline plane that is inclined 50° or more, 90° or less with respect to a plane, being either the (0001) plane or the (000$\bar{1}$) plane, through the arbitrary point is obtained.

The method for growing the further GaN crystal 120, while not particularly limited preferably is, from the perspective of growing GaN crystal of high crystalline quality, a vapor-phase method such as an HVPE technique, an MOCVD technique or an MBE technique, or a liquid-phase method such as flux growth. From the perspective of the crystal growth rate being considerable, an HVPE technique is further preferable. If the further GaN crystal 120 is grown by an HVPE technique, from the perspective of making the off-inclination angle through the aforementioned arbitrary point in the GaN substrate 1 small, the crystal-growth conditions preferably are that the crystal-growth temperature is 950° C. or more, 1200° C. or less, and the crystal-growth rate is 30 μm/hr or more, 300 μm/hr or less.

Embodying Mode 2

Reference is made to FIG. 1 through FIG. 3: One mode of embodying a GaN substrate involving the present invention is a GaN substrate 1, stored within an atmosphere in which the oxygen concentration is not greater than 15 vol. % and the water-vapor concentration is not greater than 20 g/m³, having a planar first principal face 1m, and whose plane orientation in an arbitrary point along the first principal face 1m and separated 3 mm or more from the outer edge thereof has an off-inclination angle Δα of −10° or more, 10° or less with respect to the plane orientation of an arbitrarily designated crystalline plane 1a that is inclined 50° or more, 90° or less with respect to a plane 1c, being either the (0001) plane or the (000$\bar{1}$) plane, through the arbitrary point. With a GaN substrate of the present embodying mode, stored by a method of Embodying Mode 1, because surface oxidation is kept to a minimum, by growing an at least single-lamina semiconductor layer onto the first principal face 1m, a semiconductor device of superior properties is obtained.

Embodying Mode 3

Figure 4A:
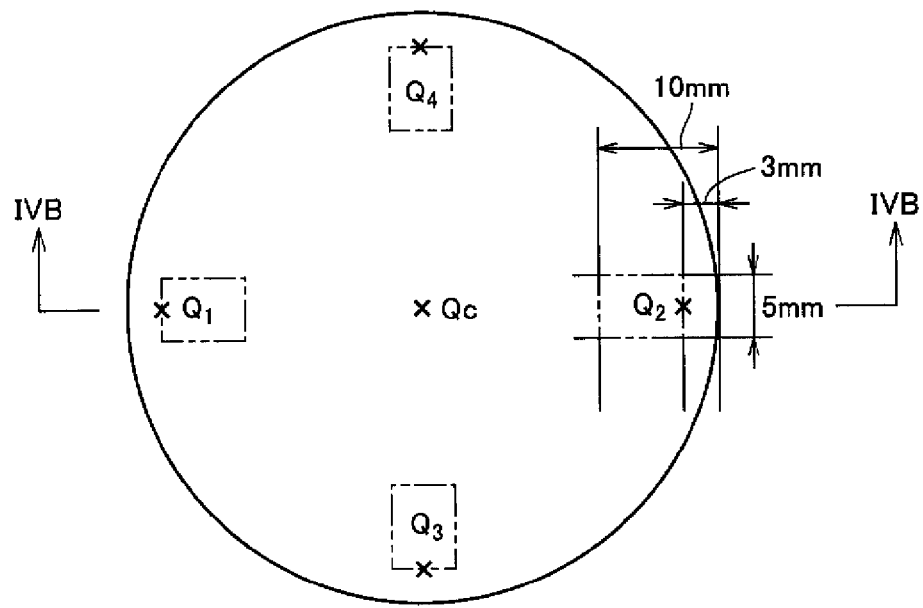
FIG. 4A is a simplified diagram specifically representing one mode of embodying a semiconductor device including a GaN substrate involving the present invention to depict a simplified plan view of the GaN substrate.
Figure 4B:
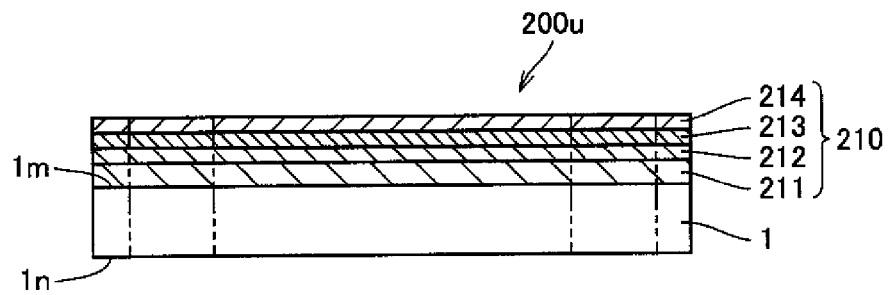
FIG. 4B is a simplified diagram specifically representing one mode of embodying a semiconductor device including a GaN substrate involving the present invention to depict a simplified sectional view along IVB-IVB in FIG. 4A.
Figure 5:
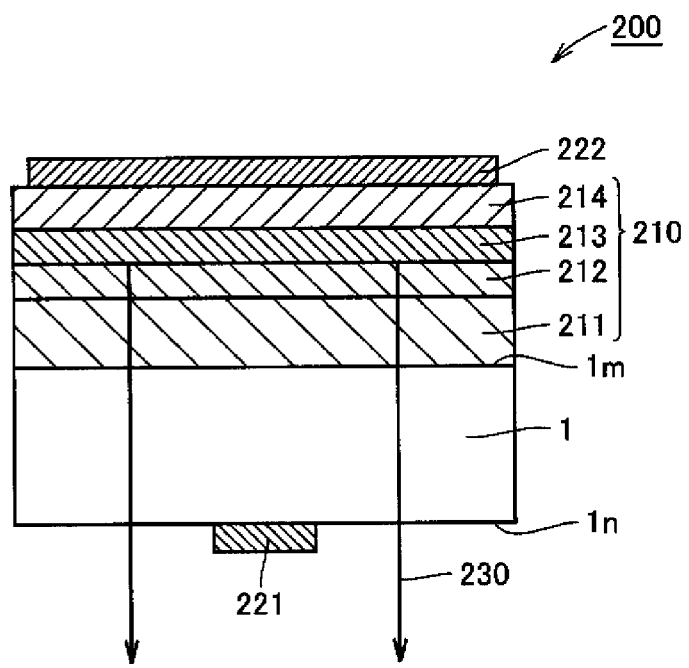
FIG. 5 is a simplified sectional diagram representing one mode of embodying a semiconductor device involving the present invention.

Reference is made to FIG. 4 and FIG. 5: One mode of embodying a semiconductor device involving the present invention includes a GaN substrate 1 of Embodying Mode 2, stored by a method of Embodying Mode 1, and an at least single-lamina semiconductor layer 210 formed onto the first principal face 1m of the GaN substrate 1. With a semiconductor device of the present embodying mode, because a semiconductor layer 210 of high crystalline quality is formed onto the first principal face 1m of a GaN substrate 1 in which oxidation of its surfaces has been kept to a minimum, a semiconductor device of superior properties is obtained.

There are no particular limitations on the semiconductor layer 210 formed onto the GaN substrate 1, but in view of the crystal lattices being highly coordinate, a Group III nitride semiconductor layer such as an $Al_xGa_yIn_{1-x-y}N$ (0≤x, 0≤y, x+y≤1) layer is preferable. Likewise, while there are no particular limitations on the semiconductor-layer formation method, from the perspective of forming a semiconductor layer 210 of high crystalline quality onto the GaN substrate 1, it is preferable to employ an HVPE technique, an MOCVD technique or an MBE technique. From the viewpoint of allowing precise control of the thickness and chemical composition of the semiconductor layer 210 formed onto the GaN substrate 1, an MOCVD technique is further preferable.

With a semiconductor device of the present embodying mode, referring to FIG. 4 and FIG. 5, specifically an n-type GaN lamina 211, an $In_{0.2}Ga_{0.8}N$ lamina 212, an $Al_{0.2}Ga_{0.8}N$ lamina 213, and a p-type GaN lamina 214 are formed as the at least single-lamina semiconductor layer 210 in order onto the first principal face 1m of a GaN substrate 1 of Embodying Mode 2, and further, onto the second principal face 1n of the GaN substrate 1, an n-side electrode 221 is formed, and onto the principal face of the p-type GaN layer 214 a p-side electrode 222 is, wherein photoemission 230 is put out.

Embodiment 4

Reference is made to FIG. 3 through FIG. 5: One mode of embodying a method, involving the present invention, of manufacturing a semiconductor device includes a step of preparing a GaN substrate 1 of Embodying Mode 2, stored by a method of Embodying Mode 1, and a step of growing an at least single-lamina semiconductor layer 210 onto the first principal face 1m of the GaN substrate 1. By such steps a semiconductor device of superior properties is obtained.

A semiconductor-device manufacturing method of the present embodying mode, referring to FIG. 3 through FIG. 5, includes the step of preparing a GaN substrate 1 of Embodying Mode 2, stored by a method of Embodying Mode 1. Such step of preparing a GaN substrate 1 is as set forth in Embodying Mode 1 and Embodying Mode 2.

A semiconductor-device manufacturing method of the present embodying mode, referring to FIG. 4 and FIG. 5, includes the step of growing an at least single-lamina semiconductor layer 210 onto the first principal face 1m of the GaN substrate 1. The semiconductor layer 210 grown onto the GaN substrate 1, while not particularly limited, preferably is, in view of the crystal lattices being highly coordinate, a Group III nitride semiconductor layer such as an $Al_xGa_yIn_{1-x-y}N$ (0≤x, 0≤y, x+y≤1) layer. Likewise, while there are no particular limitations on the semiconductor-layer growth method, from the perspective of epitaxially growing the semiconductor layer 210 with ease onto the GaN substrate 1, it is preferable to employ an HVPE technique, an MOCVD technique or an MBE technique. From the viewpoint of allowing precise control of the thickness and chemical composition of the semiconductor layer 210 grown onto the GaN substrate 1, an MOCVD technique is further preferable.

With a semiconductor device manufacturing method of the present embodying mode, referring to FIG. 4 and FIG. 5, by for example growing, by means of an MOCVD technique, in order onto the first principal face 1m of the GaN substrate 1 of Embodying Mode 2, an n-type GaN lamina 211, an $In_{0.2}Ga_{0.8}N$ lamina 212, an $Al_{0.2}Ga_{0.8}N$ lamina 213, and a p-type GaN lamina 214, as the at least single-lamina semiconductor layer 210, a semiconductor layer wafer 200u is obtained. Subsequently, by forming an n-side electrode 221 onto the second principal face 1n of the GaN substrate 1 in the semiconductor layer wafer 200u, and forming a p-side electrode 222 onto the principal face of the p-type GaN layer 214, a semiconductor device 200 is obtained. The thus-obtained semiconductor device 200 puts out photoemission 230.

EMBODIMENT EXAMPLES

Embodiment Example I

1. Manufacture of GaN Substrates

Figure 6A:
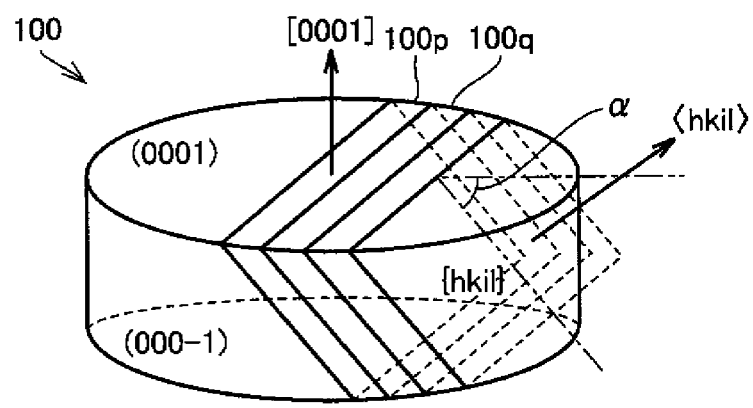
FIG. 6A is a simplified diagram representing a method of manufacturing a GaN substrate involving the present invention to represent an operation of cutting a plurality of GaN parent-crystal pieces from a GaN parent crystal.

Reference is made to FIG. 6A: The (0001) side and the (000$\bar{1}$) side—the two principal faces—of a GaN parent crystal 100 of 50.8 mm diameter and 3 mm thickness, produced by an HVPE technique, were ground and polished to an average roughness Ra of the two principal faces of 5 nm. Herein, the average roughness Ra of the surfaces was characterized employing AFM.

Subsequently, the GaN parent crystal 100 with the average roughness Ra of its two principal faces having been made 5 nm was sliced in a plurality of planes perpendicular to <20 $\bar{2}$ 1> directions, whereby a plurality of GaN parent-crystal pieces 100p and 100q, having {20$\bar{2}$1} principal faces, of 3.1 mm width, 20 to 50.8 mm length, and 1 mm thickness were cut from it. Following that, the not-ground and not-polished four sides of each cut-out GaN parent-crystal piece were ground and polished to bring the average roughness Ra of the four sides to 5 nm. Thus, a plurality of GaN parent-crystal pieces whose {20$\bar{2}$1} principal-face average roughness Ra was 5 nm were obtained. Among these GaN parent-crystal pieces were GaN parent-crystal pieces whose principal-face plane orientation did not coincide with {20$\bar{2}$1}, but even with any of such GaN parent-crystal pieces the off-inclination angle of its principal-face plane orientation with respect to {20$\bar{2}$1} was −0.1° or more, 0.4° or less. Herein, the off-inclination angle was measured by x-ray diffractometry.

Figure 6B:
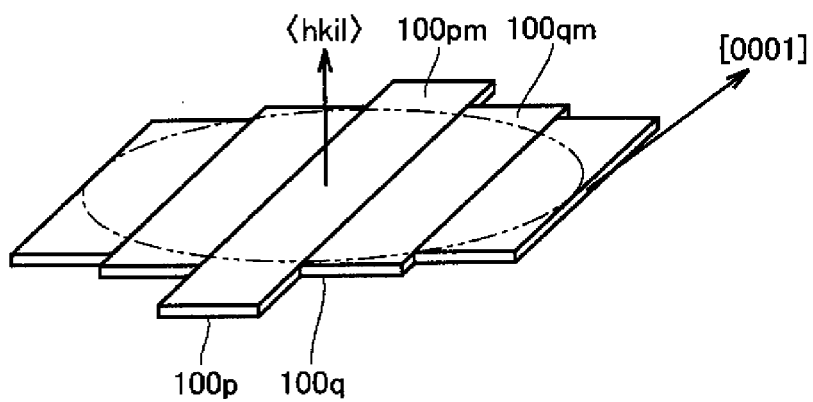
FIG. 6B is a simplified diagram representing a method of manufacturing a GaN substrate involving the present invention to represent an operation of arranging a plurality of GaN parent-crystal pieces adjoining each other sideways.

Next, referring to FIG. 6B, these GaN parent-crystal pieces were arranged adjoining each other sideways inside the crystal-growth chamber of an HVPE apparatus, in such a way that the {20 $\bar{2}$ 1} principal faces 100$pm$ and 100$qm$ of the plurality of GaN parent-crystal pieces 100$p$ and 100$q$ paralleled each other, and in such a way that the [0001] directions of the GaN parent-crystal pieces 100$p$ and 100$q$ were identical. In that situation, referring to FIG. 1C, the average roughness Ra of the mutually adjoining lateral sides 100$pt$ and 100$qt$ of the plurality of GaN parent-crystal pieces 100$p$ and 100$q$ was 5 nm. The diameter of a circle inscribed on the outer periphery of, as whole, the plurality of GaN parent-crystal pieces 100$p$ and 100$q$ arranged in this way was 50.8 mm.

Figure 6C:
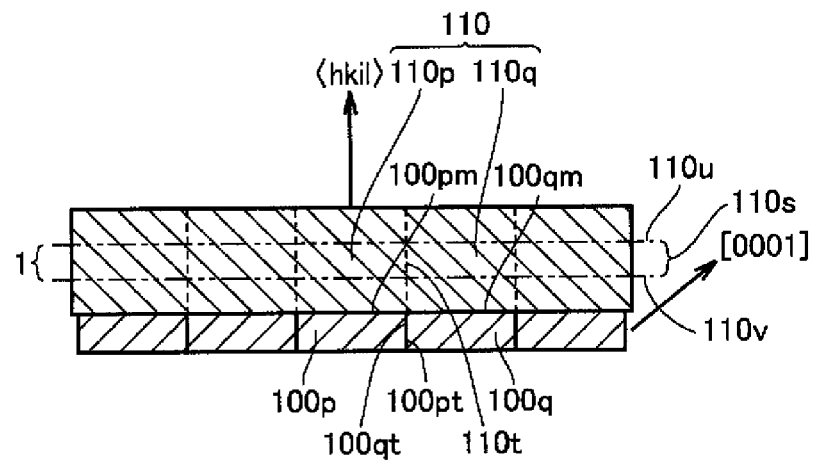
FIG. 6C is a simplified diagram representing a method of manufacturing a GaN substrate involving the present invention to represent an operation of growing GaN crystal onto the plurality of parent-crystal GaN pieces and cutting out a GaN substrate.
Figure 6D:
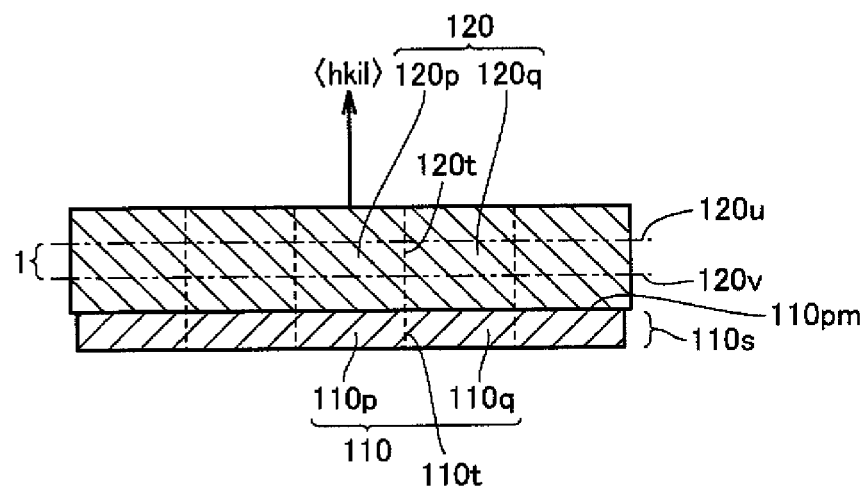
FIG. 6D is a simplified diagram representing a method of manufacturing a GaN substrate involving the present invention to represent a further operation of growing GaN crystal and cutting out a GaN substrate.
Figure 7:
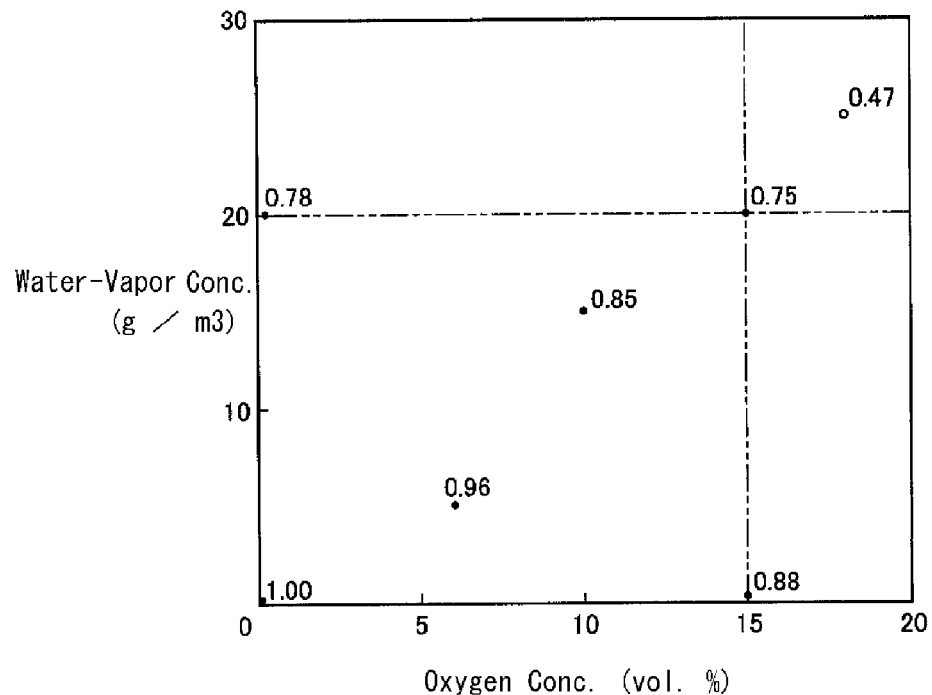
FIG. 7 is a graph charting one example of the relationship between semiconductor device properties, and oxygen concentration and water-vapor concentration in an atmosphere for storing GaN substrates.
Figure 8:
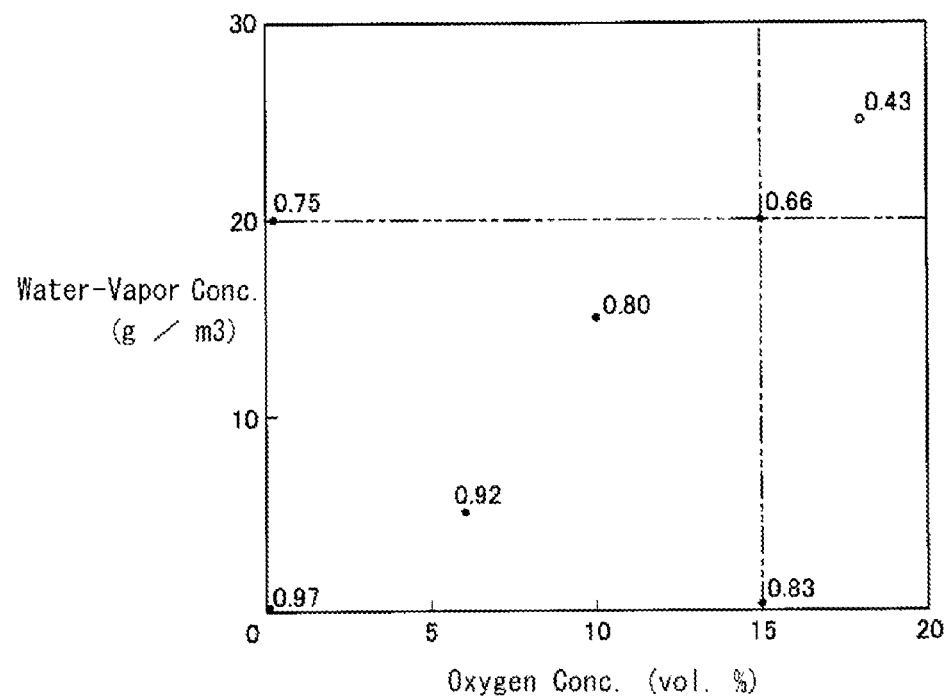
FIG. 8 is a graph charting another example of the relationship between semiconductor device properties, and oxygen concentration and water-vapor concentration in an atmosphere for storing GaN substrates.
Figure 9:
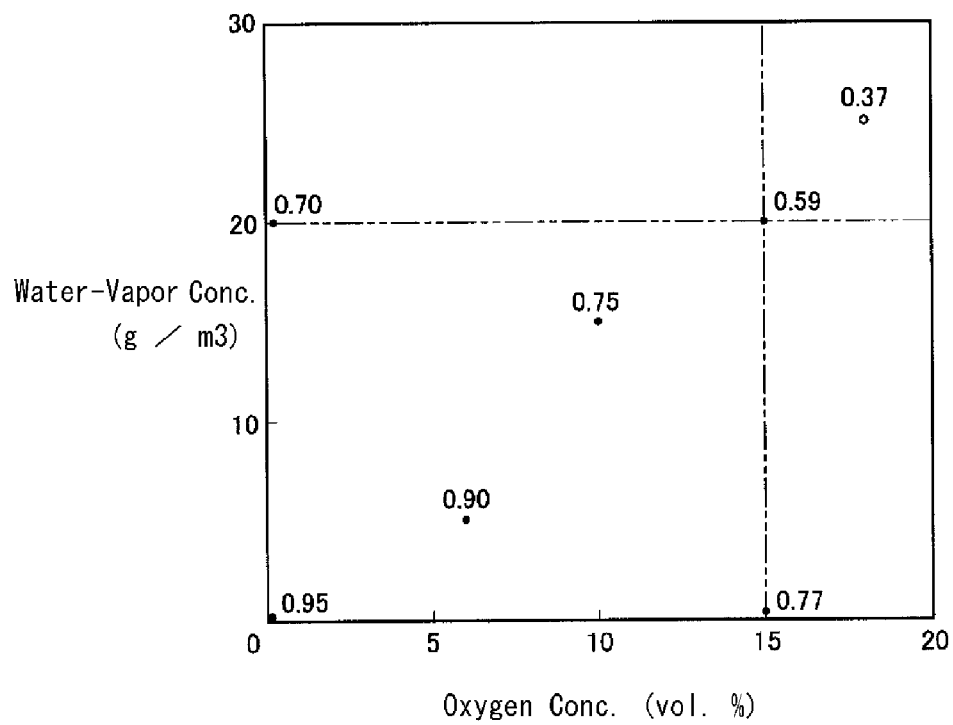
FIG. 9 is a graph charting a further example of the relationship between semiconductor device properties, and oxygen concentration and water-vapor concentration in an atmosphere for storing GaN substrates.
Figure 10:
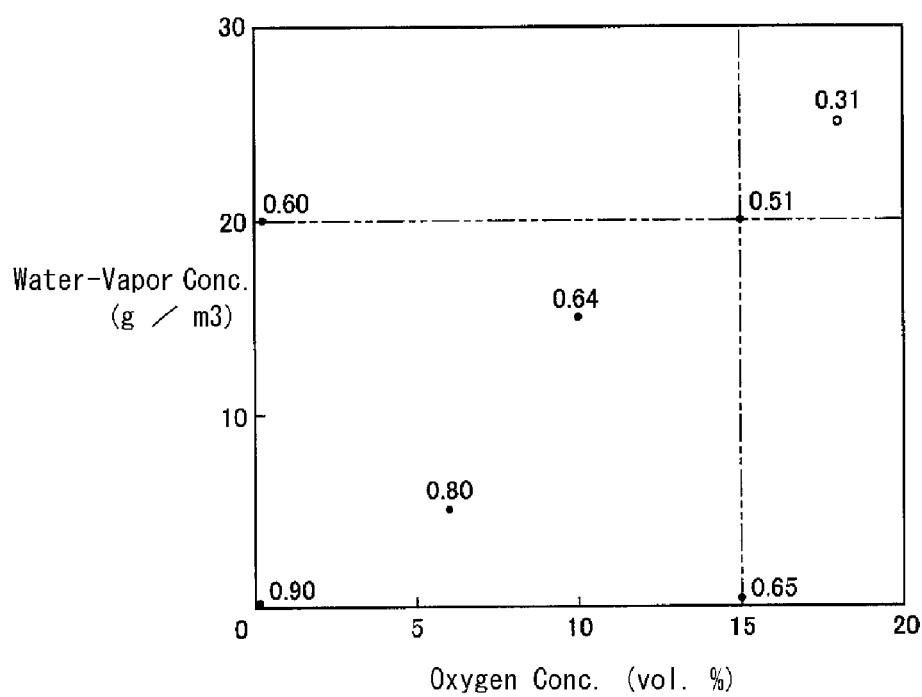
FIG. 10 is a graph charting a still further example of the relationship between semiconductor device properties, and oxygen concentration and water-vapor concentration in an atmosphere for storing GaN substrates.

Next, referring to FIG. 6C, the {20 $\bar{2}$ 1} principal faces 100$pm$ and 100$qm$ of the plurality of GaN parent-crystal pieces 100$p$ and 100$q$ arranged inside the crystal-growth chamber of the HVPE apparatus were treated two hours at 800° C. under a mixed-gas atmosphere of 10 vol. % gaseous hydrogen chloride (HCl) and 90 vol. % gaseous nitrogen ($N_2$), after which GaN crystal 110 was grown 50 hours by an HVPE technique onto the principal faces 100$pm$ and 100$qm$ under conditions in which the partial pressure of the hydrogen chloride gas that reacts with the Ga melt to generate the Ga chloride gas that is the Ga source-material gas was 2.2 kPa, the partial pressure of the ammonia ($NH_3$) gas that is the nitrogen source-material gas was 15.6 kPa, and the crystal-growth temperature was 1080° C.

The thickness of the obtained GaN crystal 110 was measured by a contact thickness gauge (a "Digimatic Indicator," Mitutoyo Corp. mfr.), whereupon it was 4 mm. That meant that the crystal growth rate was 80 μm/hr. Referring to FIG. 6C, FIG. 2 and FIG. 3: By cutting eight GaN substrates out of this GaN crystal 110 in planes 110$u$ and 110$v$ parallel to a {20 $\bar{2}$ 1} plane, and carrying out grinding and polishing processes on their two principal faces, eight GaN substrates were obtained, of 50.8 mm diameter×400 μm thickness, whose first principal-face 1$m$ average roughness Ra was 3 nm and whose second principal-face 1$n$ average roughness Ra was 8 μm, and whose off-inclination angle toward a <1 $\bar{2}$ 10> direction (the x-axis direction in FIG. 3) and whose off-inclination angle toward a direction (the y-axis direction in FIG. 3) perpendicular to a <20 $\bar{2}$ 1> direction and a <1 $\bar{2}$ 10> direction—being the off-inclination angles between the first principal face and a {20 $\bar{2}$ 1} plane in each of points, along the first principal face 1$m$, Point $P_c$, Point $P_1$, Point $P_2$, Point $P_3$ and Point $P_4$—are each entered in Table I.

Herein, referring to FIG. 3, Point $P_c$, is a point in the middle of the GaN substrate 1 on its first principal face 1$m$, while Point $P_1$, Point $P_2$, Point $P_3$ and Point $P_4$ are each a point on the first principal face and separated 3 mm from the outer edge thereof, with Point $P_1$, Point $P_c$ and Point $P_2$ lying in that order on a straight line in a <1 $\bar{2}$ 10> direction and Point $P_3$, Point $P_c$ and Point $P_4$ lying in that order on a straight line in a direction perpendicular to a <20 $\bar{2}$ 1> direction and a <1 $\bar{2}$ 10> direction.

2. Storing of GaN Substrates

Each of seven GaN substrates within the eight GaN substrates obtained as above-described was washed and then stored for six months within an atmosphere having the oxygen concentrations and water-vapor concentrations set forth in Table I—within atmospheres being a gaseous mixture of gaseous nitrogen as an inert gas, gaseous oxygen, and water vapor (Ex. I-1 through Ex. I-6 and Ex. I-R1). The remaining single GaN substrate, without undergoing storage of this sort, after the aforementioned production and washing of the GaN substrate was within 10 minutes placed inside the crystal-growth reaction chamber of an MOCVD apparatus, and semiconductor devices were fabricated as in the following (Ex. I-S).

3. Fabrication of Semiconductor Devices

Referring to FIG. 4 and FIG. 5: The foregoing seven GaN substrates following storage (Ex. I-1 through Ex. I-6 and Ex. I-R1) and the non-stored single GaN substrate (Ex. I-S) were each placed inside the crystal-growth reaction chamber of an MOCVD apparatus, and a 5-μm thick n-type GaN lamina 211, a 3-nm thick $In_{0.2}Ga_{0.8}N$ lamina 212, a 60-nm thick $Al_{0.2}Ga_{0.8}N$ lamina 213, and a 150-nm thick p-type GaN lamina 214 were grown in order, as the semiconductor layer 210, onto the first principal face 1$m$ of each GaN substrate 1 to yield a semiconductor wafer 200$u$. Herein, Point $Q_c$, Point $Q_1$, Point $Q_2$, Point $Q_3$ and Point $Q_4$ on the principal face of the semiconductor layer 210 in the semiconductor wafer 200$u$ are each positioned on a line normal to its first principal face through the Point $P_c$, Point $P_1$, Point $P_2$, Point $P_3$ and Point $P_4$ on the first principal face 1$m$ of the GaN substrate 1.

As indicated in FIG. 4, in four neighbor regions of Point $Q_1$, Point $Q_2$, Point $Q_3$ and Point $Q_4$ of 5 mm width, separated 3 mm to 10 mm from the outer edge of the principal face of the semiconductor wafer 200$u$, a 100-nm thick p-side electrode 222 was formed onto the principal face of the p-type GaN lamina 214, and then an 80-μm diameter×100-nm thick n-side electrode 221 was formed onto the second principal face of the GaN substrate, to yield, as semiconductor devices 200, ten in each neighbor region for a total 40 LEDs of 500 μm×500 μm geometry. The photoemission intensity of the 40 LEDs obtained in this way was measured by means of a spectral photometer, and their average photoemission intensities were computed. The relative average photoemission intensities of Ex. I-S, Ex. I-1 through Ex. I-6 and Ex. I-R1, letting the average photoemission intensity of semiconductor device Ex. I-S be 1.00, were tabulated in Table I.

TABLE I

| | Embodiment Example I | | | Ex. I-S | Ex. I-1 | Ex. I-2 | Ex. I-3 | Ex. I-4 | Ex. I-5 | Ex. I-6 | Ex. I-R1 |
|---|---|---|---|---|---|---|---|---|---|---|---|
| GaN substrate | Substrate diameter (mm) | | | 50 | 50 | 50 | 50 | 50 | 50 | 50 | 50 |
| | Off-inclination angle of principal face (°) | Point $P_c$ | <1 $\bar{2}$ 10> direction | 0.2 | 0.2 | 0.2 | 0.2 | 0.2 | 0.2 | 0.2 | 0.2 |
| | | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_1$ | <1 $\bar{2}$ 10> direction | 0.5 | 0.5 | 0.5 | 0.5 | 0.5 | 0.5 | 0.5 | 0.5 |
| | | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_2$ | <1 $\bar{2}$ 10> direction | -0.1 | -0.1 | -0.1 | -0.1 | -0.1 | -0.1 | -0.1 | -0.1 |
| | | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |

TABLE I-continued

| Embodiment Example I | | | Ex. I-S | Ex. I-1 | Ex. I-2 | Ex. I-3 | Ex. I-4 | Ex. I-5 | Ex. I-6 | Ex. I-R1 |
|---|---|---|---|---|---|---|---|---|---|---|
| | Point $P_3$ | <1 $\bar{2}$ 10> direction | 0.2 | 0.2 | 0.2 | 0.2 | 0.2 | 0.2 | 0.2 | 0.2 |
| | | Direct. perpend. to <20 $\bar{2}$ 1> direct. and <1 $\bar{2}$ 10> direct. | 0.5 | 0.5 | 0.5 | 0.5 | 0.5 | 0.5 | 0.5 | 0.5 |
| | Point $P_4$ | <1 $\bar{2}$ 10> direction | 0.2 | 0.2 | 0.2 | 0.2 | 0.2 | 0.2 | 0.2 | 0.2 |
| | | Direct. perpend. to <20 $\bar{2}$ 1> direct. and <1 $\bar{2}$ 10> direct. | −0.3 | −0.3 | −0.3 | −0.3 | −0.3 | −0.3 | −0.3 | −0.3 |
| Substrate storage conditions | Oxygen conc. (vol. %) | | — | 15 | 15 | 0.05 | 10 | 6 | 0.05 | 18 |
| | Water-vapor conc. (g/m³) | | — | 20 | 0.1 | 20 | 15 | 5 | 0.1 | 25 |
| | Temperature (° C.) | | — | 25 | 25 | 25 | 25 | 25 | 25 | 25 |
| | Storage term (mo.) | | — | 6 | 6 | 6 | 6 | 6 | 6 | 6 |
| Semicon. device | Device type | | LED | LED | LED | LED | LED | LED | LED | LED |
| | Relative photoemission intensity | | 1.00 (referent) | 0.75 | 0.88 | 0.78 | 0.85 | 0.96 | 1.00 | 0.47 |

Referring to Table I, with regard to semiconductor devices in which an at least single-lamina semiconductor layer was formed onto the first principal face of a GaN substrate whose plane orientation in an arbitrary point (e.g., Point $P_1$, Point $P_2$, Point $P_3$ or Point $P_4$) along the first principal face and separated 3 mm or more from the outer edge thereof had an off-inclination angle of −0.5° or more, 0.5° or less in a <1 $\bar{2}$ 10> direction with respect to {20 $\bar{2}$ 1} and −0.5° or more, 0.5° or less in a direction perpendicular to a <20 $\bar{2}$ 1> direction and a <1 $\bar{2}$ 10> direction, the following was understood. The relative average photoemission intensity of semiconductor devices (Ex. I-1 through Ex. I-6) utilizing GaN substrates stored within an atmosphere ranging from an oxygen concentration of 0.05 vol. % and water-vapor concentration of 0.1 g/m³ to an oxygen concentration of 15 vol. % and water-vapor concentration of 20 g/m³ was sustained at a high 0.75 to 1.00 with respect to the relative average photoemission intensity of the semiconductor device (Ex. I-S) employing the post-formation not-stored GaN substrate.

Embodiment Example II

1. Manufacture of GaN Substrates

In the same way as with Embodiment Example I, a plurality of GaN parent-crystal pieces was cut from a GaN parent crystal. With any of the cut-out GaN parent-crystal pieces, the off-inclination angle of its principal-face plane orientation with respect to {20 $\bar{2}$ 1} was −2° or more, 2° or less. Next, the plurality of GaN parent crystals was arranged in the same way as with Embodiment Example I, and GaN crystal was grown by an HVPE technique onto their principal face. The GaN crystal was grown 40 hours under conditions in which the partial pressure of the hydrogen chloride gas that reacts with the Ga melt to generate the Ga chloride gas that is the Ga source-material gas was 3.3 kPa, the partial pressure of the ammonia (NH₃) gas that is the nitrogen source-material gas was 15.6 kPa, and the crystal-growth temperature was 1080° C. The obtained GaN crystal had 5 mm thickness. That meant that the crystal growth rate was 125 μm/hr. Next, in the same way as with Embodiment Example I, by cutting eight GaN substrates out of the GaN crystal and grinding and polishing their two principal faces, eight GaN substrates were obtained, of 50.8 mm diameter×400 μm thickness, whose first principal-face average roughness Ra was 4.3 nm and whose second principal-face average roughness Ra was 9.3 μm, and whose off-inclination angle toward a <1 $\bar{2}$ 10> direction and whose off-inclination angle toward a direction perpendicular to a <20 $\bar{2}$ 1> direction and a <1 $\bar{2}$ 10> direction—being the off-inclination angles between the first principal face and a {20 $\bar{2}$ 1} plane in each of points, along the first principal face, Point $P_c$, Point $P_1$, Point $P_2$, Point $P_3$ and Point $P_4$—are each entered in Table II.

2. Storing of GaN Substrates

Each of seven GaN substrates within the eight GaN substrates obtained as above-described was washed and then stored for six months within an atmosphere having the oxygen concentrations and water-vapor concentrations set forth in Table II—within atmospheres being a gaseous mixture of gaseous nitrogen as an inert gas, gaseous oxygen, and water vapor (Ex. II-1 through Ex. II-6 and Ex. II-R1). The remaining single GaN substrate, without undergoing storage of this sort, after the aforementioned production and washing of the GaN substrate was within 10 minutes placed inside the crystal-growth reaction chamber of an MOCVD apparatus, and semiconductor devices were fabricated as in the following (Ex. II-S).

3. Fabrication of Semiconductor Devices

On each of the foregoing seven GaN substrates following storage (Ex. II-1 through Ex. II-6 and Ex. II-R1) and the non-stored single GaN substrate (Ex. II-S), in the same way as with Embodiment Example I, 40 LEDs, being semiconductor devices, were fabricated. The relative average photoemission intensities of Ex. II-1 through Ex. II-6 and Ex. II-R1, letting the average photoemission intensity of semiconductor device Ex. II-S be 1.00, were tabulated in Table II.

TABLE II

| Embodiment Example II | | | | Ex. II-S | Ex. II-1 | Ex. II-2 | Ex. II-3 | Ex. II-4 | Ex. II-5 | Ex. II-6 | Ex. II-R1 |
|---|---|---|---|---|---|---|---|---|---|---|---|
| GaN substrate | Substrate diameter (mm) | | | 50 | 50 | 50 | 50 | 50 | 50 | 50 | 50 |
| | Off-inclination angle of principal face (°) | Point $P_c$ | <1 $\bar{2}$ 10> direction | 0.2 | 0.2 | 0.2 | 0.2 | 0.2 | 0.2 | 0.2 | 0.2 |
| | | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_1$ | <1 $\bar{2}$ 10> direction | 2.8 | 2.8 | 2.8 | 2.8 | 2.8 | 2.8 | 2.8 | 2.8 |
| | | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |

TABLE II-continued

| Embodiment Example II | | | Ex. II-S | Ex. II-1 | Ex. II-2 | Ex. II-3 | Ex. II-4 | Ex. II-5 | Ex. II-6 | Ex. II-R1 |
|---|---|---|---|---|---|---|---|---|---|---|
| | Point $P_2$ | <1 $\bar{2}$ 10> direction | −2.5 | −2.5 | −2.5 | −2.5 | −2.5 | −2.5 | −2.5 | −2.5 |
| | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | Point $P_3$ | <1 $\bar{2}$ 10> direction | 0.2 | 0.2 | 0.2 | 0.2 | 0.2 | 0.2 | 0.2 | 0.2 |
| | | Direct. perpend. to <20 $\bar{2}$ 1> direct. and <1 $\bar{2}$ 10> direct. | 2.7 | 2.7 | 2.7 | 2.7 | 2.7 | 2.7 | 2.7 | 2.7 |
| | Point $P_4$ | <1 $\bar{2}$ 10> direction | 0.2 | 0.2 | 0.2 | 0.2 | 0.2 | 0.2 | 0.2 | 0.2 |
| | | Direct. perpend. to <20 $\bar{2}$ 1> direct. and <1 $\bar{2}$ 10> direct. | −2.5 | −2.5 | −2.5 | −2.5 | −2.5 | −2.5 | −2.5 | −2.5 |
| Substrate storage conditions | | Oxygen conc. (vol. %) | — | 15 | 15 | 0.05 | 10 | 6 | 0.05 | 18 |
| | | Water-vapor conc. (g/m$^3$) | — | 20 | 0.1 | 20 | 15 | 5 | 0.1 | 25 |
| | | Temperature (° C.) | — | 25 | 25 | 25 | 25 | 25 | 25 | 25 |
| | | Storage term (mo.) | — | 6 | 6 | 6 | 6 | 6 | 6 | 6 |
| Semicon. device | Device type | | LED | LED | LED | LED | LED | LED | LED | LED |
| | Relative photoemission intensity | | 1.00 (referent) | 0.66 | 0.83 | 0.75 | 0.8 | 0.92 | 0.97 | 0.43 |

Referring to Table II, with regard to semiconductor devices in which an at least single-lamina semiconductor layer was formed onto the first principal face of a GaN substrate whose plane orientation in an arbitrary point (e.g., Point $P_1$, Point $P_2$, Point $P_3$ or Point $P_4$) along the first principal face and separated 3 mm or more from the outer edge thereof had an off-inclination angle of −3.0° or more, 3.0° or less in a <1 $\bar{2}$ 10> direction with respect to {20 $\bar{2}$ 1} and −3.0° or more, 3.0° or less in a direction perpendicular to a <20 $\bar{2}$ 1> direction and a <1 $\bar{2}$ 10> direction, the following was understood. The relative average photoemission intensity of semiconductor devices (Ex. II-1 through Ex. II-6) utilizing GaN substrates stored within an atmosphere ranging from an oxygen concentration of 0.05 vol. % and water-vapor concentration of 0.1 g/m$^3$ to an oxygen concentration of 15 vol. % and water-vapor concentration of 20 g/m$^3$ was sustained at a high 0.66 to 0.97 with respect to the relative average photoemission intensity of the semiconductor device (Ex. II-S) employing the post-formation not-stored GaN substrate.

Embodiment Example III

1. Manufacture of GaN Substrates

In the same way as with Embodiment Example I, a plurality of GaN parent-crystal pieces was cut from a GaN parent crystal. With any of the cut-out GaN parent-crystal pieces, the off-inclination angle of its principal-face plane orientation with respect to {20 $\bar{2}$ 1} was −5° or more, 5° or less. Next, the plurality of GaN parent crystals was arranged in the same way as with Embodiment Example I, and GaN crystal was grown by an HVPE technique onto their principal face. The GaN crystal was grown 40 hours under conditions in which the partial pressure of the hydrogen chloride gas that reacts with the Ga melt to generate the Ga chloride gas that is the Ga source-material gas was 4.3 kPa, the partial pressure of the ammonia (NH$_3$) gas that is the nitrogen source-material gas was 15.6 kPa, and the crystal-growth temperature was 1080° C. The obtained GaN crystal had 6 mm thickness. That meant that the crystal growth rate was 150 μm/hr. Next, in the same way as with Embodiment Example I, by cutting eight GaN substrates out of the GaN crystal and grinding and polishing their two principal faces, eight GaN substrates were obtained, of 50.8 mm diameter×400 μm thickness, whose first principal-face average roughness Ra was 2.3 nm and whose second principal-face average roughness Ra was 3.1 μm, and whose off-inclination angle toward a <1 $\bar{2}$ 10> direction and whose off-inclination angle toward a direction perpendicular to a <20 $\bar{2}$ 1> direction and a <1 $\bar{2}$ 10> direction—being the off-inclination angles between the first principal face and a {20 $\bar{2}$ 1} plane in each of points, along the first principal face, Point $P_c$, Point $P_1$, Point $P_2$, Point $P_3$ and Point $P_4$—are each entered in Table III.

2. Storing of GaN Substrates

Each of seven GaN substrates within the eight GaN substrates obtained as above-described was washed and then stored for six months within an atmosphere having the oxygen concentrations and water-vapor concentrations set forth in Table III—within atmospheres being a gaseous mixture of gaseous nitrogen as an inert gas, gaseous oxygen, and water vapor (Ex. III-1 through Ex. III-6 and Ex. III-R1). The remaining single GaN substrate, without undergoing storage of this sort, after the aforementioned production and washing of the GaN substrate was within 10 minutes placed inside the crystal-growth reaction chamber of an MOCVD apparatus, and semiconductor devices were fabricated as in the following (Ex. III-S).

3. Fabrication of Semiconductor Devices

On each of the foregoing seven GaN substrates following storage (Ex. III-1 through Ex. III-6 and Ex. III-R1) and the non-stored single GaN substrate (Ex. III-S), in the same way as with Embodiment Example I, 40 LEDs, being semiconductor devices, were fabricated. The relative average photoemission intensities of Ex. III-1 through Ex. III-6 and Ex. III-R1, letting the average photoemission intensity of semiconductor device Ex. III-S be 1.00, were tabulated in Table III.

TABLE III

| Embodiment Example III | | | Ex. III-S | Ex. III-1 | Ex. III-2 | Ex. III-3 | Ex. III-4 | Ex. III-5 | Ex. III-6 | Ex. III-R1 |
|---|---|---|---|---|---|---|---|---|---|---|
| GaN substrate | Substrate diameter (mm) | | 50 | 50 | 50 | 50 | 50 | 50 | 50 | 50 |
| | Off-inclination angle of principal face (°) | Point $P_c$ <1 $\bar{2}$ 10> direction | 0.2 | 0.2 | 0.2 | 0.2 | 0.2 | 0.2 | 0.2 | 0.2 |
| | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_1$ <1 $\bar{2}$ 10> direction | 6 | 6 | 6 | 6 | 6 | 6 | 6 | 6 |
| | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_2$ <1 $\bar{2}$ 10> direction | −5.8 | −5.8 | −5.8 | −5.8 | −5.8 | −5.8 | −5.8 | −5.8 |
| | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_3$ <1 $\bar{2}$ 10> direction | 0.2 | 0.2 | 0.2 | 0.2 | 0.2 | 0.2 | 0.2 | 0.2 |
| | | Direct. perpend. to <20 $\bar{2}$ 1> direct. and <1 $\bar{2}$ 10> direct. | −5.5 | −5.5 | −5.5 | −5.5 | −5.5 | −5.5 | −5.5 | −5.5 |
| | | Point $P_4$ <1 $\bar{2}$ 10> direction | 0.2 | 0.2 | 0.2 | 0.2 | 0.2 | 0.2 | 0.2 | 0.2 |
| | | Direct. perpend. to <20 $\bar{2}$ 1> direct. and <1 $\bar{2}$ 10> direct. | 5.6 | 5.6 | 5.6 | 5.6 | 5.6 | 5.6 | 5.6 | 5.6 |
| | Substrate storage conditions | Oxygen conc. (vol. %) | — | 15 | 15 | 0.05 | 10 | 6 | 0.05 | 18 |
| | | Water-vapor conc. (g/m³) | — | 20 | 0.1 | 20 | 15 | 5 | 0.1 | 25 |
| | | Temperature (° C.) | — | 25 | 25 | 25 | 25 | 25 | 25 | 25 |
| | | Storage term (mo.) | — | 6 | 6 | 6 | 6 | 6 | 6 | 6 |
| Semicon. device | Device type | | LED | LED | LED | LED | LED | LED | LED | LED |
| | Relative photoemission intensity | | 1.00 (referent) | 0.59 | 0.77 | 0.70 | 0.75 | 0.90 | 0.95 | 0.37 |

Referring to Table III, with regard to semiconductor devices in which an at least single-lamina semiconductor layer was formed onto the first principal face of a GaN substrate whose plane orientation in an arbitrary point (e.g., Point $P_1$, Point $P_2$, Point $P_3$ or Point $P_4$) along the first principal face and separated 3 mm or more from the outer edge thereof had an off-inclination angle of −6.0° or more, 6.0° or less in a <1 $\bar{2}$ 10> direction with respect to {20 $\bar{2}$ 1} and −6.0° or more, 6.0° or less in a direction perpendicular to a <20 $\bar{2}$ 1> direction and a <1 $\bar{2}$ 10> direction, the following was understood. The relative average photoemission intensity of semiconductor devices (Ex. III-1 through Ex. III-6) utilizing GaN substrates stored within an atmosphere ranging from an oxygen concentration of 0.05 vol. % and water-vapor concentration of 0.1 g/m³ to an oxygen concentration of 15 vol. % and water-vapor concentration of 20 g/m³ was sustained at a high 0.59 to 0.95 with respect to the relative average photoemission intensity of the semiconductor device (Ex. III-S) employing the post-formation not-stored GaN substrate.

Embodiment Example IV

1. Manufacture of GaN Substrates

In the same way as with Embodiment Example I, a plurality of GaN parent-crystal pieces was cut from a GaN parent crystal. With any of the cut-out GaN parent-crystal pieces, the off-inclination angle of its principal-face plane orientation with respect to {20 $\bar{2}$ 1} was −9° or more, 9° or less. Next, the plurality of GaN parent crystals was arranged in the same way as with Embodiment Example I, and GaN crystal was grown by an HVPE technique onto their principal face. The GaN crystal was grown 40 hours under conditions in which the partial pressure of the hydrogen chloride gas that reacts with the Ga melt to generate the Ga chloride gas that is the Ga source-material gas was 6.4 kPa, the partial pressure of the ammonia (NH₃) gas that is the nitrogen source-material gas was 15.6 kPa, and the crystal-growth temperature was 1080° C. The obtained GaN crystal had 8 mm thickness. That meant that the crystal growth rate was 200 μm/hr. Next, in the same way as with Embodiment Example I, by cutting eight GaN substrates out of the GaN crystal and grinding and polishing their two principal faces, eight GaN substrates were obtained, of 50.8 mm diameter×400 μm thickness, whose first principal-face average roughness Ra was 0.6 nm and whose second principal-face average roughness Ra was 0.8 μm, and whose off-inclination angle toward a <1 $\bar{2}$ 10> direction and whose off-inclination angle toward a direction perpendicular to a <20 $\bar{2}$ 1> direction and a <1 $\bar{2}$ 10> direction—being the off-inclination angles between the first principal face and a {20 $\bar{2}$ 1} plane in each of points, along the first principal face, Point $P_c$, Point $P_1$, Point $P_2$, Point $P_3$ and Point $P_4$—are each entered in Table IV.

2. Storing of GaN Substrates

Each of seven GaN substrates within the eight GaN substrates obtained as above-described was washed and then stored for six months within an atmosphere having the oxygen concentrations and water-vapor concentrations set forth in Table IV—within atmospheres being a gaseous mixture of gaseous nitrogen as an inert gas, gaseous oxygen, and water vapor (Ex. IV-1 through Ex. IV-6 and Ex. IV-R1). The remaining single GaN substrate, without undergoing storage of this sort, after the aforementioned production and washing of the GaN substrate was within 10 minutes placed inside the crystal-growth reaction chamber of an MOCVD apparatus, and semiconductor devices were fabricated as in the following (Ex. IV-S).

3. Fabrication of Semiconductor Devices

On each of the foregoing seven GaN substrates following storage (Ex. IV-1 through Ex. IV-6 and Ex. IV-R1) and the non-stored single GaN substrate (Ex. IV-S), in the same way as with Embodiment Example I, 40 LEDs, being semiconductor devices, were fabricated. The relative average photoemission intensities of Ex. IV-1 through Ex. IV-6 and Ex. IV-R1, letting the average photoemission intensity of semiconductor device Ex. IV-S be 1.00, were tabulated in Table IV.

TABLE IV

| Embodiment Example IV | | | Ex. IV-S | Ex. IV-1 | Ex. IV-2 | Ex. IV-3 | Ex. IV-4 | Ex. IV-5 | Ex. IV-6 | Ex. IV-R1 |
|---|---|---|---|---|---|---|---|---|---|---|
| GaN substrate | Substrate diameter (mm) | | 50 | 50 | 50 | 50 | 50 | 50 | 50 | 50 |
| | Off-inclination angle of principal face (°) | Point $P_c$ | <1 $\bar{2}$ 10> direction | 0.2 | 0.2 | 0.2 | 0.2 | 0.2 | 0.2 | 0.2 | 0.2 |
| | | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_1$ | <1 $\bar{2}$ 10> direction | 9.7 | 9.7 | 9.7 | 9.7 | 9.7 | 9.7 | 9.7 | 9.7 |
| | | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_2$ | <1 $\bar{2}$ 10> direction | −9.8 | −9.8 | −9.8 | −9.8 | −9.8 | −9.8 | −9.8 | −9.8 |
| | | | Direct. perpend. to <20 $\bar{2}$ 1> direct. and <1 $\bar{2}$ 10> direct. | 0.1 | 0.1 | 0.1 | 0.1 | 0.1 | 0.1 | 0.1 | 0.1 |
| | | Point $P_3$ | <1 $\bar{2}$ 10> direction | 0.2 | 0.2 | 0.2 | 0.2 | 0.2 | 0.2 | 0.2 | 0.2 |
| | | | Direct. perpend. to <20 $\bar{2}$ 1> direct. and <1 $\bar{2}$ 10> direct. | −9.5 | −9.5 | −9.5 | −9.5 | −9.5 | −9.5 | −9.5 | −9.5 |
| | | Point $P_4$ | <1 $\bar{2}$ 10> direction | 0.2 | 0.2 | 0.2 | 0.2 | 0.2 | 0.2 | 0.2 | 0.2 |
| | | | Direct. perpend. to <20 $\bar{2}$ 1> direct. and <1 $\bar{2}$ 10> direct. | 9.6 | 9.6 | 9.6 | 9.6 | 9.6 | 9.6 | 9.6 | 9.6 |
| | Substrate storage conditions | Oxygen conc. (vol. %) | — | 15 | 15 | 0.05 | 10 | 6 | 0.05 | 18 |
| | | Water-vapor conc. (g/m³) | — | 20 | 0.1 | 20 | 15 | 5 | 0.1 | 25 |
| | | Temperature (° C.) | — | 25 | 25 | 25 | 25 | 25 | 25 | 25 |
| | | Storage term (mo.) | — | 6 | 6 | 6 | 6 | 6 | 6 | 6 |
| Semicon. device | Device type | | LED | LED | LED | LED | LED | LED | LED | LED |
| | Relative photoemission intensity | | 1.00 (referent) | 0.51 | 0.65 | 0.60 | 0.64 | 0.80 | 0.90 | 0.31 |

Referring to Table IV, with regard to semiconductor devices in which an at least single-lamina semiconductor layer was formed onto the first principal face of a GaN substrate whose plane orientation in an arbitrary point (e.g., Point $P_1$, Point $P_2$, Point $P_3$ or Point $P_4$) along the first principal face and separated 3 mm or more from the outer edge thereof had an off-inclination angle of −10.0° or more, 10.0° or less in a <1 $\bar{2}$ 10> direction with respect to {20 $\bar{2}$ 1} and −10.0° or more, 10.0° or less in a direction perpendicular to a <20 $\bar{2}$ 1> direction and a <1 $\bar{2}$ 10> direction, the following was understood. The relative average photoemission intensity of semiconductor devices (Ex. IV-1 through Ex. IV-6) utilizing GaN substrates stored within an atmosphere ranging from an oxygen concentration of 0.05 vol. % and water-vapor concentration of 0.1 g/m³ to an oxygen concentration of 15 vol. % and water-vapor concentration of 20 g/m³ was sustained at a high 0.51 to 0.90 with respect to the relative average photoemission intensity of the semiconductor device (Ex. IV-S) employing the post-formation not-stored GaN substrate.

It should be noted that although in the foregoing Embodiment Example I through Embodiment Example IV the storing term is in each case 6 months, it has been verified that the effects obtained do not change if the storing term is under 6 months or exceeds 6 months.

The embodying modes and embodiment examples disclosed at this time should in all respects be considered to be illustrative and not limiting. The scope of the present invention is set forth not by the foregoing description but by the scope of the claims, and is intended to include meanings equivalent to the scope of the claims and all modifications within the scope.

REFERENCE SIGNS LIST

1: GaN substrate; 1*a*: crystalline plane; 1*c*: plane being either the (0001) plane or the (000$\bar{1}$) plane; 1*m*, 1*n*, 100*pm*, 100*qm*, 110*pm*: principal faces; 10: storing device; 20: gas introduction line; 23, 43: gases; 29: gas introduction valve; 31: oxygen scavenger; 32: dehydrating agent; 40: gas exhaust line; 49: gas exhaust valve; 100: GaN parent crystal; 100*p*, 100*q*: GaN parent-crystal pieces; 100*pt*, 100*qt*: lateral sides; 110, 120: GaN crystal; 110*p*, 110*q*, 120*p*, 120*q*: sectional regions; 110*s*: GaN starting substrate; 110*t*, 120*t*: extension planes; 110*u*, 110*v*, 120*u*, 120*v*: parallel planes; 200: semiconductor device; 200*u*: semiconductor wafer; 210: semiconductor layer; 211: n-type GaN lamina; 212: $In_{0.2}Ga_{0.8}N$ lamina; 213: $Al_{0.2}Ga_{0.8}N$ lamina; 214: p-type GaN lamina; 221: n-side electrode; 222: p-side electrode; 230: photoemission

What is claimed is:

1. A GaN substrate stored within an atmosphere in which the oxygen concentration is not greater than 15 vol. % and the water-vapor concentration is not greater than 20 g/m³, the GaN substrate having opposite sides encompassed by a peripheral edge, one of said opposite sides being a planar first principal face and the other of said opposite sides being a second principal face, said first principal face having an average roughness Ra of not greater than 20 nm and being of plane orientation having, in an arbitrary point along the first principal face and separated at least 3 mm from said peripheral edge, an off-inclination angle of between −10° and 10°, inclusive, with respect to an arbitrarily designated crystalline plane, through said arbitrary point, of plane orientation inclined between 50° and 90°, inclusive, with respect to either the (0001) plane or the (000$\bar{1}$) plane, and said second principal face having an average roughness Ra of not greater than 20 μm.

2. The GaN substrate set forth in claim 1, wherein the average roughness Ra of said first principal face is not greater than 5 nm, and the average roughness Ra of said second principal face is not greater than 10 μm.

3. A GaN substrate stored within an atmosphere in which the oxygen concentration is not greater than 15 vol. % and the water-vapor concentration is not greater than 20 g/m³, the GaN substrate having opposite sides encompassed by a peripheral edge, one of said opposite sides being a planar first principal face of plane orientation having, in an arbitrary point along the first principal face and separated at least 3 mm from said peripheral edge, an off-inclination angle of between −10° and 10°, inclusive, with respect to an arbitrarily designated {20 $\bar{2}$ 1} crystalline plane through said arbitrary point.

4. A GaN substrate stored within an atmosphere in which the oxygen concentration is not greater than 15 vol. % and the water-vapor concentration is not greater than 20 g/m³, the GaN substrate having opposite sides encompassed by a peripheral edge, one of said opposite sides being a planar first principal face of plane orientation having, in an arbitrary point along the first principal face and separated at least 3 mm from said peripheral edge, an off-inclination angle of between −10° and 10°, inclusive, in a <1 $\bar{2}$ 10> direction with respect to an arbitrarily designated {20 $\bar{2}$ 1} crystalline plane through said arbitrary point, and of between −10° and 10°, inclusive, in a direction perpendicular to a <20 $\bar{2}$ 1> direction and to a <1 $\bar{2}$ 10> direction.

5. The GaN substrate set forth in claim 4, wherein the plane orientation of said first principal face has an off-inclination angle of between −3° and 3°, inclusive, in a <1 $\bar{2}$ 10> direction with respect to {20 $\bar{2}$ 1}, and between −3° and 3°, inclusive, in a direction perpendicular to a <20 $\bar{2}$ 1> direction and to a <1 $\bar{2}$ 10> direction.

6. The GaN substrate set forth in claim 4, wherein the plane orientation of said first principal face has an off-inclination angle of between −0.5° and 0.5°, inclusive, in a <1 $\bar{2}$ 10> direction with respect to {20 $\bar{2}$ 1}, and between −0.5° and 0.5°, inclusive, in a direction perpendicular to a <20 $\bar{2}$ 1> direction and to a <1 $\bar{2}$ 10> direction.

\* \* \* \* \*